(12) United States Patent
Sugiyama (10) Patent No.: US 6,281,569 B1
(45) Date of Patent: *Aug. 28, 2001

(54) PRESSURE-CONTACT SEMICONDUCTOR DEVICE

(75) Inventor: Koichi Sugiyama, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,598

(22) Filed: Sep. 11, 1998

(30) Foreign Application Priority Data

Sep. 17, 1997 (JP) .................................... 9-252163

(51) Int. Cl.[7] .................................................. H01L 23/48
(52) U.S. Cl. ........................................... 257/688; 257/727
(58) Field of Search ..................................... 257/688, 727

(56) References Cited

U.S. PATENT DOCUMENTS 5,610,439 * 3/1997 Hiyoshi et al. ........................ 257/688
5,739,556 * 4/1998 Bolgiani .............................. 257/182

FOREIGN PATENT DOCUMENTS 7-94673   4/1995  (JP) .
8-116019  5/1996  (JP) .
8-330338 * 12/1996 (JP) .

OTHER PUBLICATIONS

High Turn–off Current Capability of Parallel–connected 4.5kV Trench–IEGTs, pp. 47–50, Proceedings of 1998 International Symposium on Power Semiconductor Devices & ICs, Kyoto by Tsuneo OGURA et al.
Turn–off Characteristics of Parallel–connected 4.5kV Trench–gate IEGTs, pp. 61–65, by Koichi Sugiyama et al.

* cited by examiner

Primary Examiner—Olik Chaudhuri
Assistant Examiner—Douglas A. Wille
(74) Attorney, Agent, or Firm—Oblon, Spivak, McClelland, Maier & Neustadt, P.C.

(57) ABSTRACT

A pressure-contact semiconductor device comprises a first main electrode plate, a second main electrode plate facing the first main electrode plate, an insulating enclosure for holding the periphery of each of the first and second main electrode plates in such a manner that the first and second main electrode plates face each other, a gate terminal provided so as to penetrate the enclosure, a gate electrode plate which is insulatively provided on the main surface of the first main electrode facing the second main electrode and which is electrically connected to the gate terminal, pressure-contact pins which are insulatively provided on the main surface of the first main electrode and which are electrically connected to the gate electrode plate, and semiconductor chips which are arranged in such a manner that the chips are sandwiched and pressed by the first and second main electrode plates and which each have a first and a second main electrode in pressure-contact with the first and second main electrode plates, respectively, and a gate electrode with which the corresponding one of the pressure-contact pins comes into pressure-contact.

15 Claims, 7 Drawing Sheets

$rg/Rg \geq n^2/(200-n)$

F I G. 13

PRESSURE-CONTACT SEMICONDUCTOR DEVICE

BACKGROUND OF THE INVENTION

1. Field of the Invention

This invention relates to a pressure-contact semiconductor in which insulated-gate semiconductor elements, such as IGBTs, are provided in a single package, and more particularly to a pressure-contact semiconductor device capable of improving the stability of switching operation.

2. Discussion of the Background

Pressure-contact semiconductor devices have been widely used for packages of semiconductor chips including insulated-gate elements. A pressure-contact semiconductor device has a gate terminal that penetrates the enclosure of the package and is electrically connected to the gate pad of each semiconductor chip.

In the pressure-contact semiconductor device, a plurality of semiconductor chips arranged in a plane are sandwiched and press-packed between a flat-plate emitter electrode around which an insulating enclosure is provided and a flat-plate corrector electrode, whereby the emitter electrode is made in pressure-contact with the semiconductor chips. A gate terminal is provided in such a manner that it penetrates the insulating enclosure. Inside the package (on the emitter electrode side), there are provided spring pins arranged in such a manner that each of the pins come into pressure-contact with the gate pad of each of the semiconductor chips. Leads including gate resistors connect the spring pins to the gate terminal in parallel.

In another known pressure-contact semiconductor device, semiconductor chips are arranged on a collector electrode plate, an annular insulating plate made of resin or ceramic is provided on the periphery of the collector electrode plate in such a manner that the insulating plate surrounds the semiconductor chips, and a thin layer of a gate wiring network evaporated over the insulating substrate is wire-bonded to the gate pad of each semiconductor chip. In this case, the semiconductor chips are sandwiched and press-packed between an emitter plate having protruded emitter electrode and the collector electrode plate.

Figure 1:
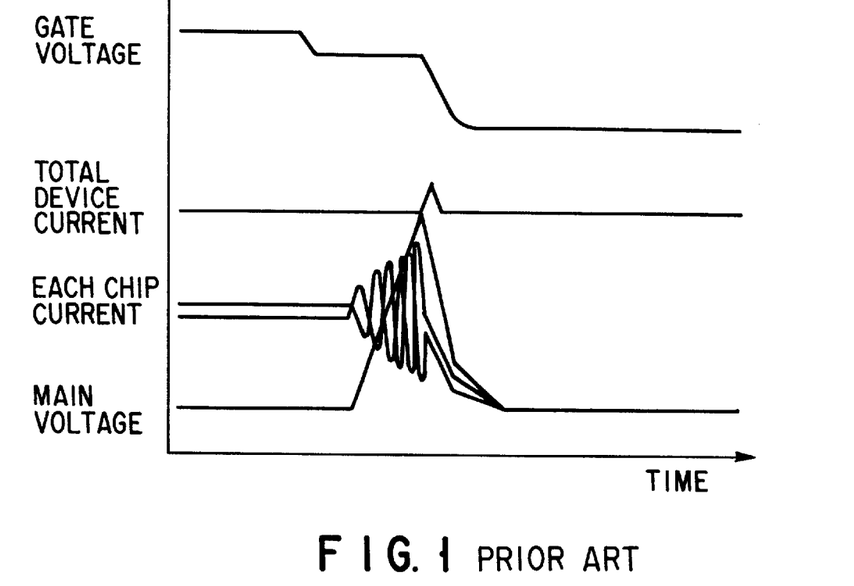
FIG. 1 shows a switching waveform of a conventional pressure-contact semiconductor device.

The above-described pressure-contact semiconductor devices have the following problems. The problem which the configuration where the individual leads are connected to the gate terminal in parallel encounters is that the inductance components of the leads corrupt the current waveform of each chip as shown in FIG. 1, which makes the switching operation unstable.

Furthermore, the problem which the configuration where the gate wiring network is bonded to each semiconductor chip encounters is that the inductance components of the gate wiring network and bonding wires cannot be ignored and therefore the current oscillates, which makes the switching operation unstable. The instability becomes more significant as the number of chips increases. The bonding connection has a long-term reliability problem stemming from vibration resistance or aging. In addition, the configuration requires insulation for high voltages between the gate wiring network and the collector electrode plate to which high voltages are applied, which leads to an insulation problem.

BRIEF SUMMARY OF THE INVENTION

The object of the present invention is to provide a pressure-contact semiconductor device capable of reducing the inductance components of the gate leads, improving the stability of switching operation, and assuring a long-term reliability.

The gist of the invention is to decrease the inductance of the gate leads by providing a metal gate electrode plate to shorten the distance to the control gates of all the semiconductor chips.

According to a first aspect of the present invention, there is provided a pressure-contact semiconductor device comprising: a first main electrode plate; a second main electrode plate facing the first main electrode plate; an insulating enclosure for holding a periphery of each of the first and the second main electrode plate in such a manner that the first and the second main electrode plate face each other; a gate terminal provided in such a manner as to penetrate the enclosure; a gate electrode plate which is insulatively provided on the main surface of the first main electrode facing the second main electrode and which is electrically connected to the gate terminal; pressure-contact pins which are insulatively provided on the main surface of the first main electrode and which are electrically connected to the gate electrode plate; and semiconductor chips which are arranged in such a manner that the chips are sandwiched and pressed by the first and the second main electrode plate, and which each have a first and a second main electrode in pressure-contact with the first and the second main electrode plate, respectively, and a gate electrode with which the corresponding one of the pressure-contact pins comes into pressure-contact.

It is desirable that the gate electrode plate has an annular, planar shape that surrounds the semiconductor chips.

The gate electrode plate may have an annular, planar shape that is arranged among the semiconductor chips.

The gate electrode plate may have a planar shape that surrounds the semiconductor chips and is arranged among the semiconductor chips.

The first main electrode plate may have a network of grooves for forming projecting portions that come into contact with the semiconductor chips in a one-to-one correspondence and the gate electrode plate is arranged in the grooves in such a manner as to form a network.

It is desirable to further comprise at least one of an oscillation prevention resistor and an oscillation prevention magnetizer between the gate electrode plate and each of the pressure-contact pins.

The pressure-contact semiconductor device may further comprise diode chips provided in such a manner as to be mixed in the semiconductor chips, the diode chips being arranged in such a manner as to come into pressure-contact with the first and the second main electrode plate and each having a third and a fourth main electrode in pressure-contact with the first and the second main electrode plate, respectively.

It is desirable that the first main electrode plate has a network of grooves for forming projecting portions that come into contact with the semiconductor chips and the diode chips in a one-to-one correspondence and that the gate electrode plate is arranged in the grooves in such a manner as to form a network and is located closer to an outermost periphery than the diode chips.

It is desirable that the pressure-contact pins include springs so as to make pressure-contact with the gate electrode.

The gate electrode plate is made of a metal plate.

According to a second aspect of the present invention, there is provided a pressure-contact semiconductor device comprising: a semiconductor chip having a first and a second main surface, the first main surface having a first main electrode and a gate electrode and the second main surface having a second main electrode; a first main electrode plate having a projecting portion which comes into contact with the first main electrode; a second main electrode plate which comes into contact with the second main electrode; a pressure-contact pin which is insulatively provided adjacent to the projecting portion and presses the gate electrode; and a gate electrode plate which is insulatively provided adjacent to the first main electrode plate and to which the pressure-contact pin is electrically connected.

The gate electrode plate is made of a metal plate.

It is desirable that the pressure-contact pin include a spring to make pressure-contact with the gate electrode.

It is desirable to further comprise at least one of an oscillation prevention resistance and an oscillation prevention magnetizer between the gate electrode plate and the pressure-contact pin.

According to a third aspect of the present invention, there is provided a pressure-contact semiconductor device comprising: a semiconductor chip having a first and a second main surface, the first main surface having a first main electrode and a gate electrode and the second main surface having a second main electrode; a first main electrode plate having a projecting portion that comes into contact with the first main electrode; a second main electrode plate that comes into contact with the second main electrode; connection means which is insulatively provided adjacent to the projecting portion and comes into elastic contact with the gate electrode to establish electrical connection; and a gate electrode plate which is provided on the first main electrode plate and to which the connection means is electrically connected.

The gate electrode plate is made of a metal plate.

It is desirable that the connection means includes a spring to make elastic contact with the gate electrode.

It is desirable to further comprise at least one of an oscillation prevention resistor and an oscillation prevention magnetizer between the gate electrode plate and the connection means.

With the present invention, the gate electrode plate connected to both the gate terminal and each lead is provided between the gate terminal and the individual lead and helps shorten the distance to the control electrodes of all the semiconductor chips. This not only decreases the inductance components of the gate leads but also facilitates resistor connection, which improves the stability of switching operation.

Because the gate electrode plate is provided on the emitter electrode plate side, insulation has only to be provided for low voltages.

Constructing the semiconductor chips of insulated-gate elements with control gates and of freewheeling diodes enables an inverter circuit or the like to produce the above effect.

Use of the annular gate electrode plate surrounding the semiconductor chips enables the inductance of the gate leads to be decreased, especially on the semiconductor chips arranged on the periphery.

Furthermore, providing the annular gate electrode plate in the area where the semiconductor chips have been arranged enables the inductance of the gate wiring to be decreased even for the semiconductor chips located in the middle of the area.

Still furthermore, providing the gate electrode plate in each groove in the first main electrode plate not only enables the inductance of the gate wiring to be decreased for all the semiconductor chips but also easily copes with an increase in the number of semiconductor chips.

Additionally, providing the gate electrode plate in each groove in the first main electrode plate and closer to the outermost periphery than all the freewheeling diodes enables the inductance of the gate wiring to be decreased for all the semiconductor chips with control electrodes.

Moreover, connecting a resistor or a magnetizer to each gate lead makes it possible to suppress an unstable operation, such as oscillation at the time of switching, even when the inductance of the gate leads cannot be ignored.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

(First Embodiment)

Figure 2:
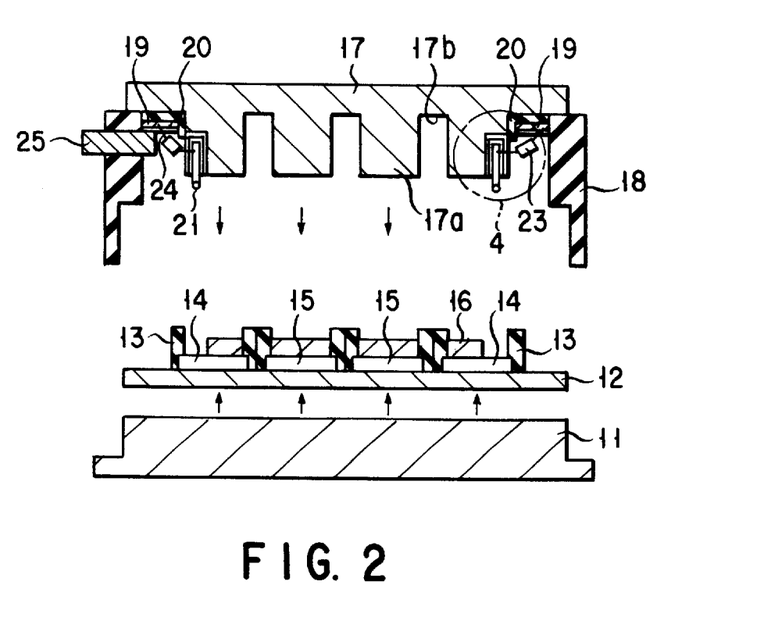
FIG. 2 is a sectional view of a pressure-contact semiconductor device according to a first embodiment of the present invention.
Figure 3:
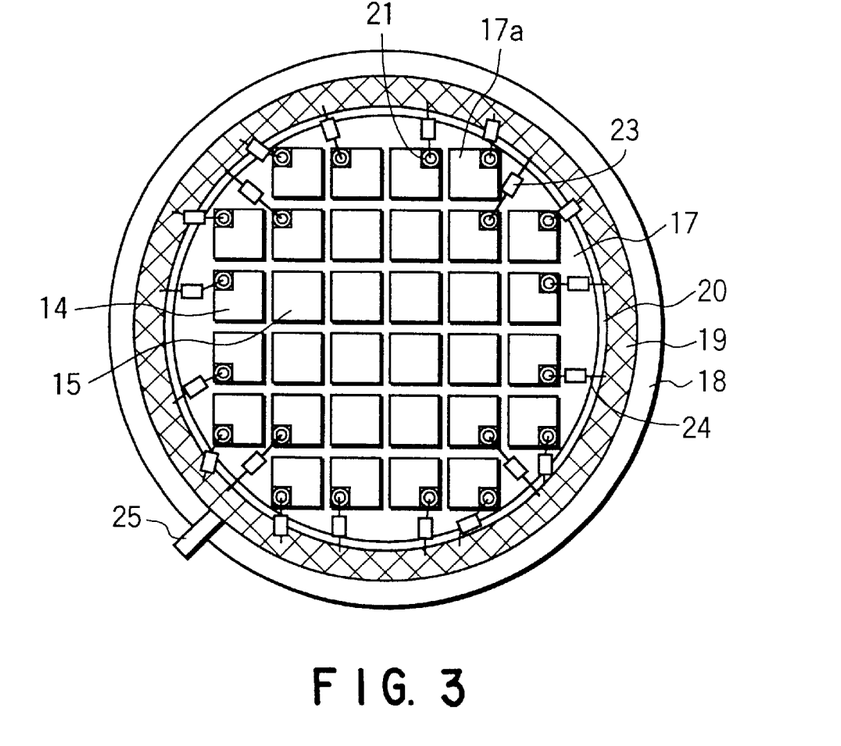
FIG. 3 is a plan view of the emitter electrode in the first embodiment, viewed from inside the package.
Figure 4:
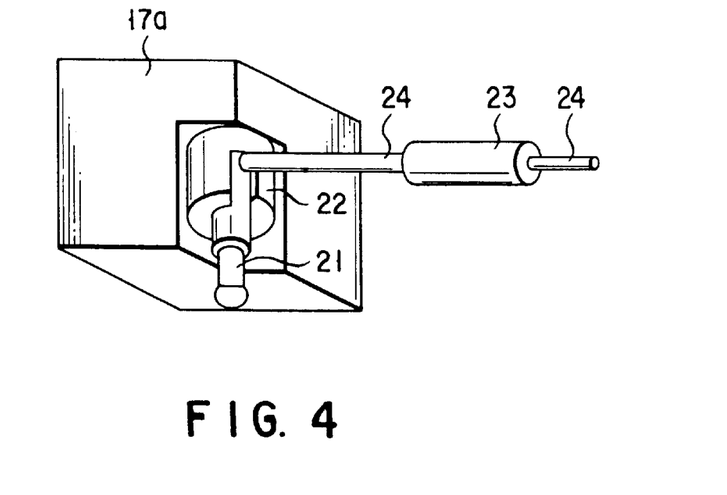
FIG. 4 is an enlarged view of the portion indicated by numeral 4 in FIG. 2.

FIG. 2 is a sectional view of a pressure-contact semiconductor device according to a first embodiment of the present invention. FIG. 3 is a plan view of the emitter electrode of the semiconductor device, viewed from inside the package. FIG. 4 is an enlarged perspective view of the projecting portion and its vicinity (or the portion indicated by numeral 4 in FIG. 2) of the emitter electrode.

In the pressure-contact semiconductor device, a lower heat buffer plate 12 and a positioning frame 13 are placed on a collector electrode 11 in that order. Inside the positioning frame 13, IGBT chips 14 and FRD (Fast Recovery Diode) chips 15 acting as freewheeling diodes are arranged in the same plane.

On the chips 14 and 15, upper heat buffer plates 16 are provided. The projecting portions 17a of an emitter electrode 17 are pressed against the corresponding upper heat buffer plates 16. The heat buffer plates 12 and 16 are made of, for example, Mo and are in pressure-contact with the collector electrode portion and emitter electrode portion of each of the chips 14 and 15, respectively.

A cylindrical enclosure 18 is bonded to the outer periphery of the emitter electrode 17. The emitter electrode 17 has multiple projecting portions 17a and a network of grooves 17b in it. An annular gate electrode plate 19 is fixed via an insulator 20 to the outermost periphery of each projecting portion 17a. The gate electrode plate 29 has been obtained by forming a copper plate of, for example, 0.5 mm or more in thickness into a ring shape. It may be formed so as to have a longitudinal sectional shape and bonded to the inner wall of the enclosure 18. The gate electrode plate 19 eliminates the need of taking the shape into account in the case of FRD chips 15 with no gate.

The projecting portion 17a on the outer periphery of the emitter electrode 17 faces the IGBT chip 14 and holds a spring pin 21 via an insulator 22. The spring pin 21 acts as a pressure-contact pin that makes pressure-contact with the gate electrode of the corresponding IGBT chip 14. The spring pin 21 is electrically connected to the gate electrode plate 19 via a resistance 23 and a gate lead 24 soldered between them.

The emitter electrode 17 and collector 11 are secured by means of the enclosure 18. The enclosure 18 is made of an insulating material, such as ceramic, and has a gate terminal 25 that penetrates the enclosure's wall. The inner end of the gate terminal 25 is firmly connected to the gate electrode plate 19 by soldering or mechanical contact. The outer end of the gate terminal 25 is connected to a gate driving unit (not shown). Specifically, the gate driving unit is electrically connected to the control (gate) electrode of the corresponding IGBT chip 14 via the gate terminal 25 penetrating the cylindrical enclosure 18, gate electrode plate 19, gate lead 24, resistance 23, and spring pin 21.

In FIG. 3, twenty IGBT chips 14 and twelve FRD chips 15 are arranged in a plane. The rated current of the pressure-contact semiconductor device can be adjusted by changing the number of IGBT chips 14 and that of FRD chips 15 or the ratio of the number of IGBT chips 14 to that of the FRD chips 15.

Figure 5:
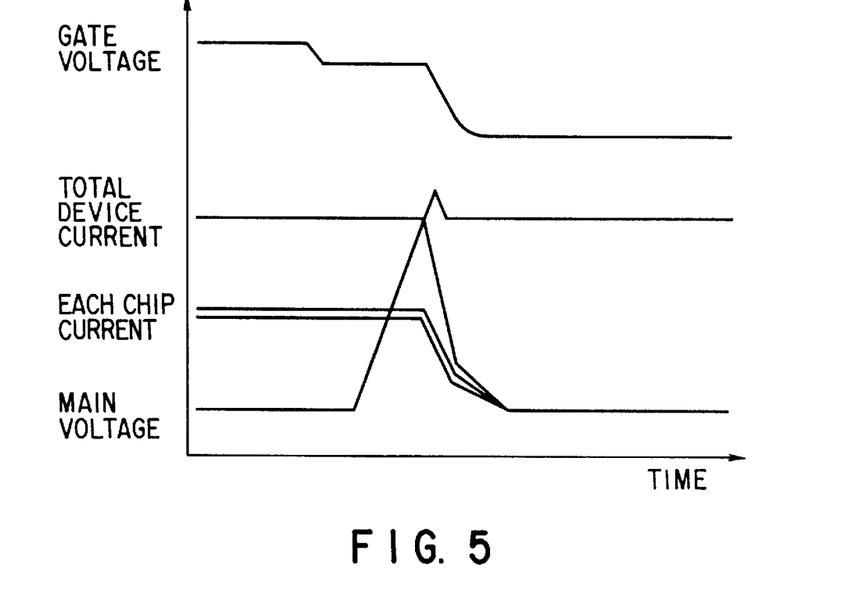
FIG. 5 shows a switching waveform of a pressure-contact semiconductor device according to the first embodiment.

With the above-described configuration, use of the thick annular gate electrode plate 19 and the short gate leads 24 enables the inductance components for all the IGBT chips 14 to be decreased, achieving a uniform, stabilized switching operation as shown in FIG. 5. Specifically, the inductance of the gate leads 24 connected to the IGBT chips 14 on the periphery of the emitter electrode 17 can be decreased by fixing the annular gate electrode plate 18 via the insulator 20 to the emitter electrode 17 (or enclosure 18) in such a manner that the plate 18 surrounds the chips 14 and 15.

Differently from conventional bonding connection, resistances 25 can be connected to the gate leads 24 as the need arises, which suppresses an unstable operation, such as oscillation at the time of switching. Namely, the decrease of the inductance components of the gate leads and the ease of resistor connection can be realized at the same time, improving the stability of switching operation.

Because the gate electrode plate 19 is provided on the emitter electrode 17 side, insulation has only to be provided against low voltages.

Furthermore, because all the connections can be secured by soldering or mechanical contact, this makes the configuration immune to vibration.

(Second Embodiment)

Figure 6:
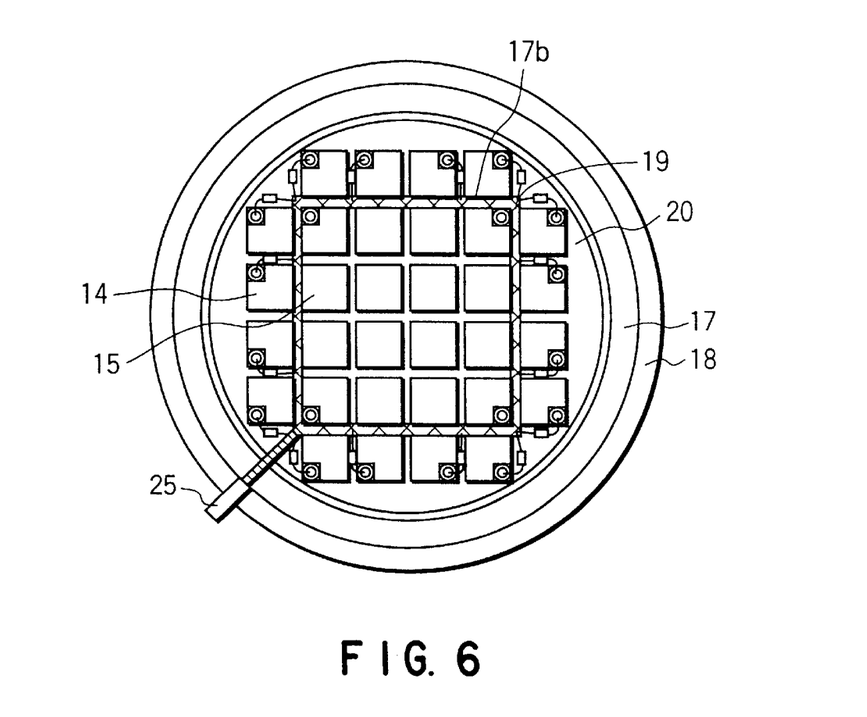
FIG. 6 is a plan view of the emitter electrode according to a second embodiment of the present invention, viewed from inside the package.

FIG. 6 is a plan view of the emitter electrode of a pressure-contact semiconductor device according to a second embodiment of the present invention, viewed from inside the package. The same parts as those in FIGS. 2 to 4 are indicated by the same reference symbols and a detailed explanation of them will not be given. Only the parts differing from those in FIGS. 2 to 4 will be explained. The same is true for the subsequent embodiments.

The second embodiment is a modification of the first embodiment. In the second embodiment, a gate electrode plate 19 is provided in the area where the chips 14, 15 are arranged. Specifically, the gate electrode plate 19 is fixed in the grooves 17b in the emitter electrode 17 via an insulator 20.

In addition to the effect of the first embodiment, this makes it possible to use shorter gate leads 24 even when the number of IGBT chips 14 is larger or even when the IGBT chips 14 are arranged in the middle of the package, which enables the inductance components of the gate leads 24 to be decreased.

(Third Embodiment)

Figure 7:
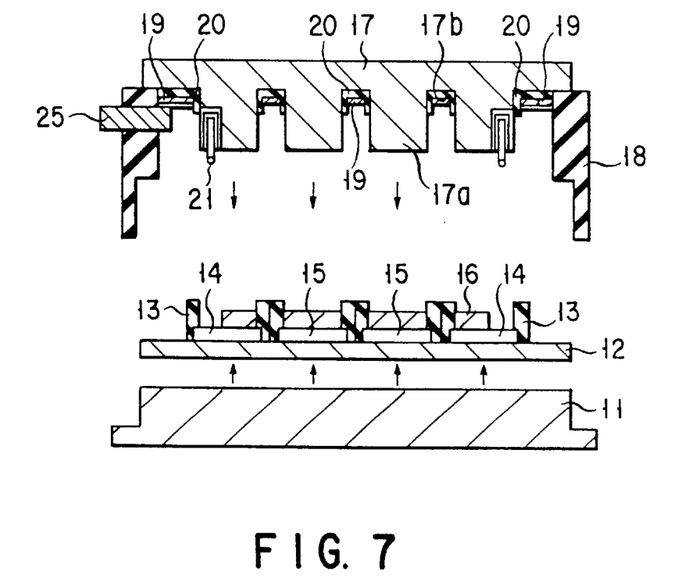
FIG. 7 is a sectional view of a pressure-contact semiconductor device according to the second embodiment.
Figure 8:
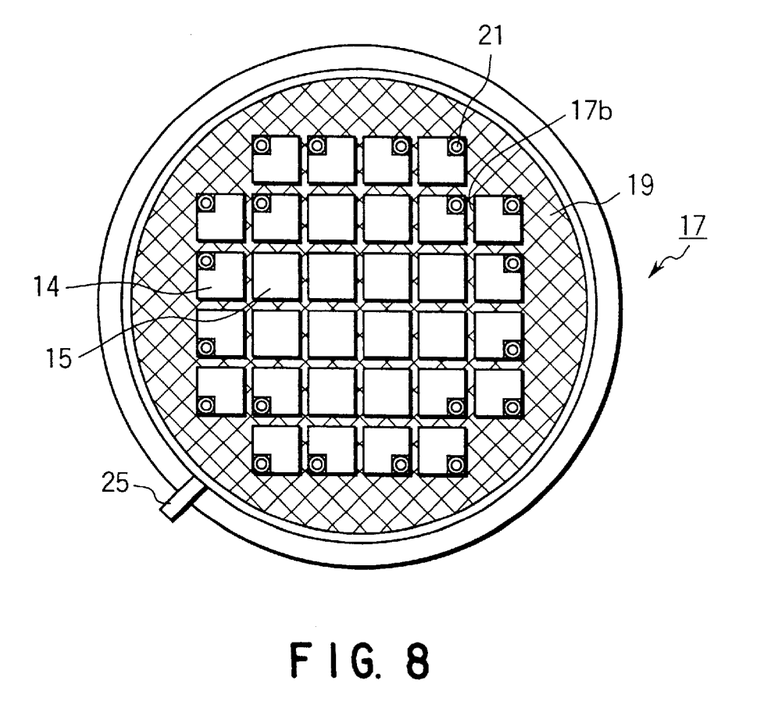
FIG. 8 is a plan view of the emitter electrode according to a third embodiment of the present invention, viewed from inside the package.

FIG. 7 is a sectional view of a pressure-contact semiconductor device according to a third embodiment of the present invention. FIG. 8 is a plan view of the emitter electrode in the third embodiment, viewed from inside the package. The third embodiment is a modification of the first embodiment. In the third embodiment, a mesh-like gate electrode plate 19 is fixed in all the grooves 17b in the emitter electrode 17.

Figure 9:
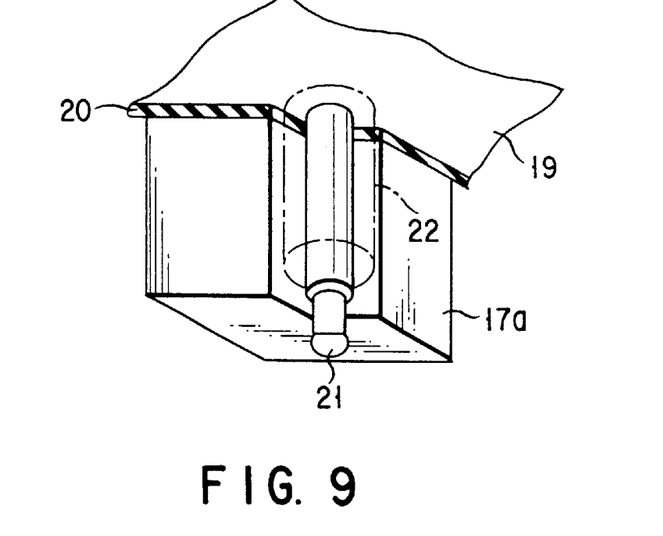
FIG. 9 pictorially shows an example of connection between the gate electrode plate and a spring pin in the third embodiment.

In this case, the gate electrode plate 19 is connected via gate leads (24) (not shown) to the spring pins 21. The gate electrode plate 19 may be connected directly to the spring pins 21 as shown in FIG. 9. In this case, each spring pin 21 is held in a projecting portion 17a via an insulator 22.

Figure 10:
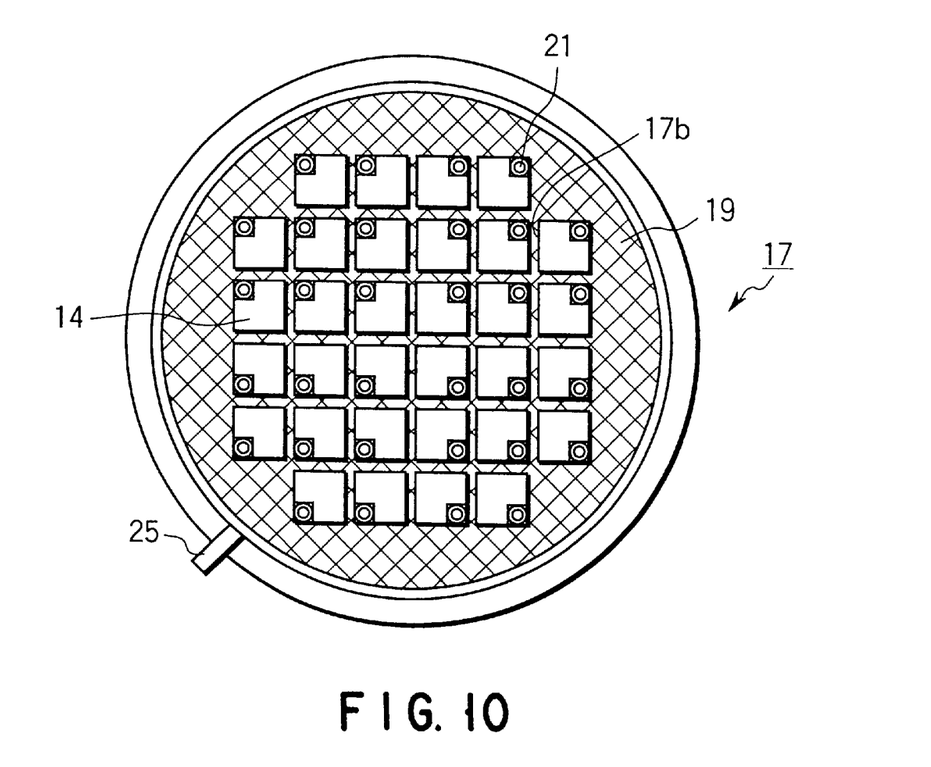
FIG. 10 is a plan view of the emitter electrode in a modification of the third embodiment, viewed from inside the package.

With the third embodiment, because the gate electrode plate 19 is arranged in all the grooves 17b, the inductance of the gate leads (24) (not shown) can be decreased even when the IGBT chips 14 are arranged in the middle of the package or all over the surface as shown in FIG. 10. As a result, the effect of the first embodiment can be assured for all the combinations of chips. Moreover, the configuration can cope with an increase in the number of semiconductor chips.

Figure 11:
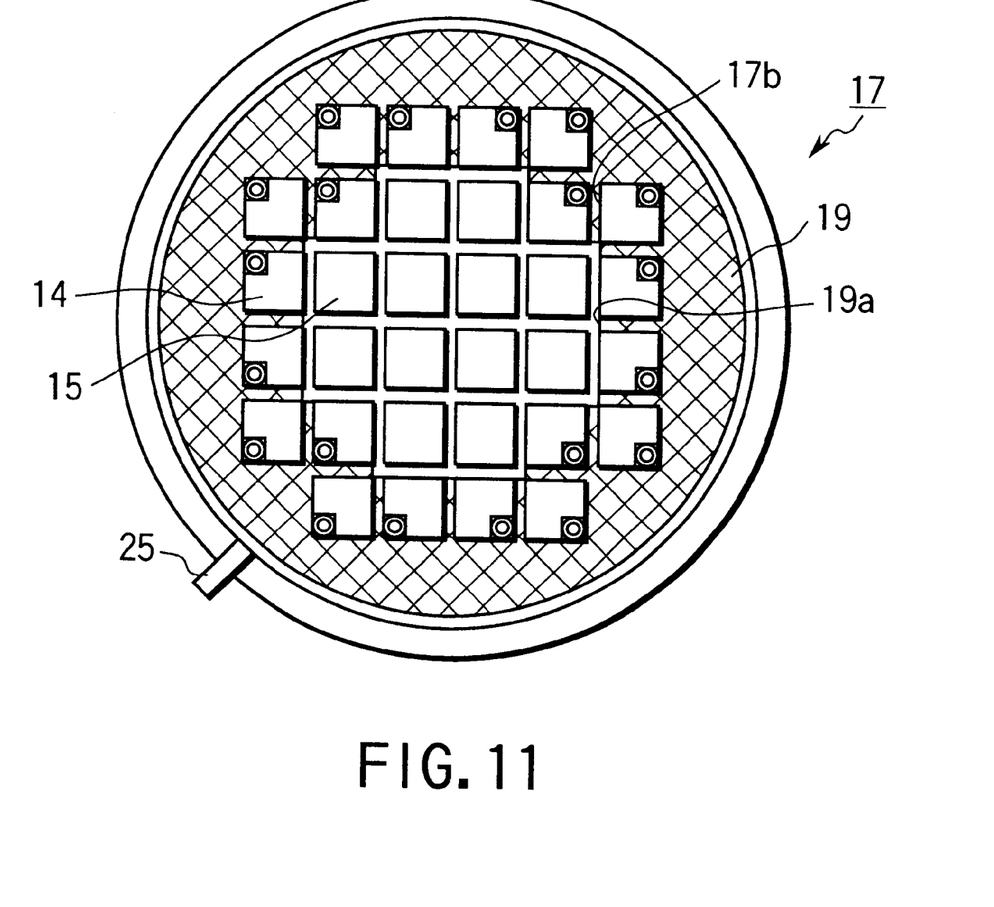
FIG. 11 is a plan view of the emitter electrode in another modification of the third embodiment, viewed from inside the package.

In the third embodiment, when FRD chips 15 are used, a large opening 19a may be made in the area of the FRD chips 15, as shown in FIG. 11. This modification produces a similar effect to that of FIG. 8.

While in the third embodiment, the resistors 23 are not used, they may be used as in the first embodiment.

(Fourth Embodiment)

Figure 12:
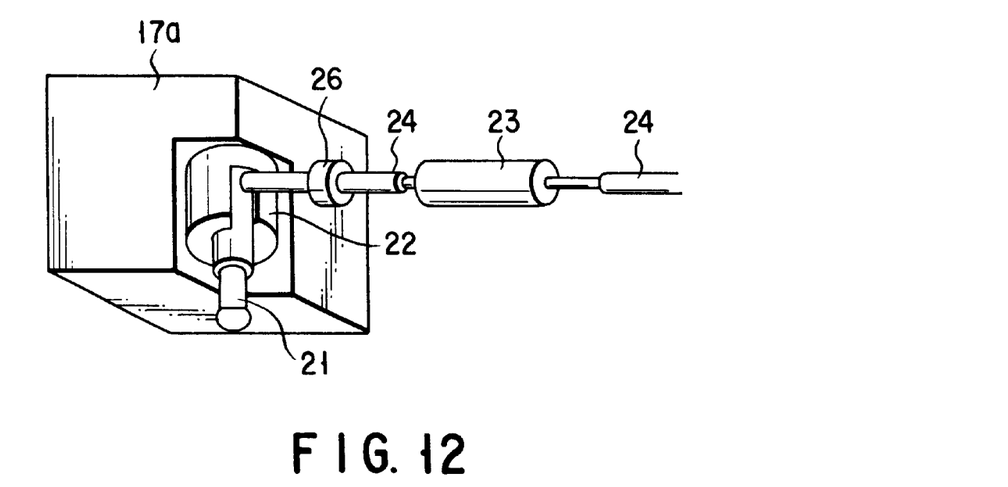
FIG. 12 is a perspective view of the structure of a gate lead according to a fourth embodiment of the present invention.

FIG. 12 is a perspective view of the structure of a gate lead according to a fourth embodiment of the present invention. The fourth embodiment is a modification of each of the first to third embodiment. Specifically, a magnetizer bead 26 made of, for example, ferrite or amorphous substance, is provided to the connection end of each gate lead 24. In FIG. 12, a gate resistor 23 is also connected to each gate lead 24.

The magnetizer bead 26 and gate resistor 23 are used to suppress oscillation caused by the wiring stray inductance Lg and wiring stray capacity of each gate lead 24 and the capacity of each IGBT. Use of either the bead 26 or the resistor 23 can also suppress oscillation at the time of switching. A thermistor or a Zener diode may be inserted.

In addition to the effect of the corresponding one of the first to third embodiment to which the above configuration is applied, this configuration can suppress an unstable operation, such as oscillation at the time of switching, even though the inductance of each gate lead 24 cannot be ignored.

(Fifth Embodiment)

A fifth embodiment of the present invention has a concrete configuration of the fourth embodiment, in which the value rg of a gate resistor 23 connected to a gate lead 24 and others are determined.

Figure 13:
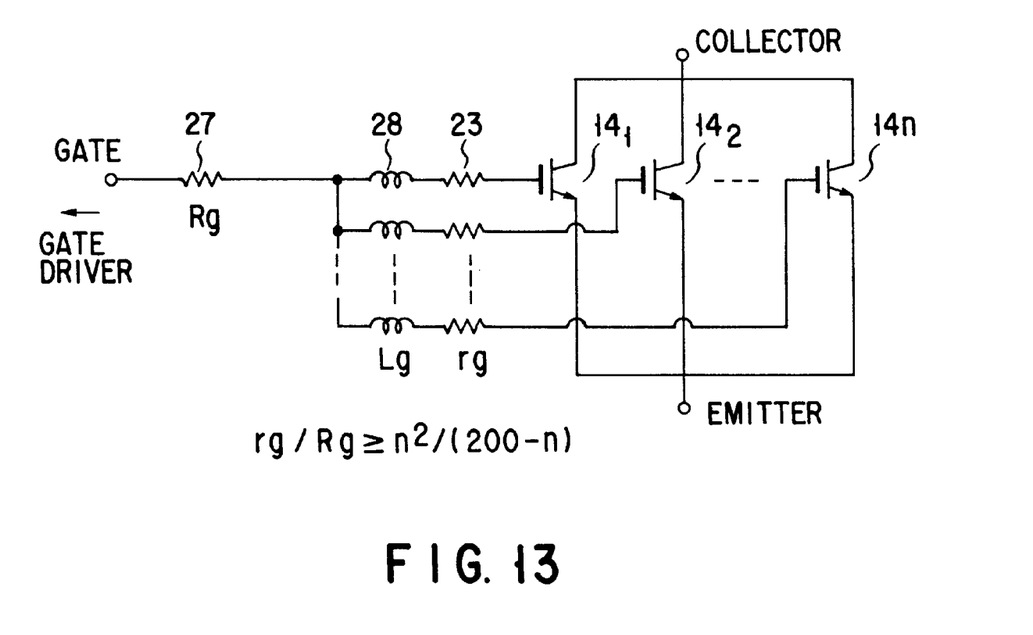
FIG. 13 is a circuit diagram of a fifth embodiment of the present invention.

FIG. 13 is a circuit diagram to help explain the fifth embodiment. An n number of IGBT chips 14 are connected in parallel. FRD chips 15 may be used or not. In the pressure-contact semiconductor device, an external gate resistor 27 is connected outside the package or near the through hole in the enclosure 18 in addition to each oscillation prevention gate resistor 23. The external gate resistor 27 is used to suppress the rate of rise of the collector-emitter voltage at the time of turning off.

It is assumed that the value of each gate resistor 23 connected to the corresponding gate lead 24 is rg and the value of each gate resistor 27 connected to the gate terminal 25 is Rg. In this case, if an n number of IGBT chips 14 are connected in parallel, the total gate resistance per chip will be (n·Rg+rg).

If the gate threshold voltage is $V_{th}$ and the gate driving voltage in the off state is $Vg_{off}$, the steady-state gate current Ig per chip in the turn-off mirror period will be expressed by the following equation (1):

$$Ig=(V_{th}-Vg_{off})/(n·Rg+rg) \quad (1)$$

Actually, however, variations in the characteristics from one IGBT chip 14 to another and the stray inductance 28 cause a varying current. If the varying current exceeds the steady-state gate current Ig, the turning-off operation will become significantly unstable.

Therefore, to keep Ig larger than the varying current, (n·Rg+rg) has the upper limit. In addition, the resistance value rg determining the time constant for the convergence of the varying current has the lower limit.

If the value of the stray inductance 28 is Lg and the total of the gate capacity of each IGBT chip and the stray capacity of gate lead is Cg, the upper limit value and lower limit value of each of them will be determined by a value proportional to $(Lg/Cg)^{1/2}$. This makes it possible to derive a condition suitable for parallel switching with respect to the resistance value ratio of rg/Rg.

The condition depends on variations in the characteristics from one IGBT chip 14 to another. If the condition is determined as expressed by the following expression (2), it will stabilize the switching operation sufficiently for chips at the product stage:

$$n^2/(200-n)<rg/Rg \quad (2)$$

where $n^2/(200-n)$ is the smallest value of (rg/Rg), taking into account variations of practical semiconductor element.

As described above, with the fifth embodiment, because the ratio (rg/Rg) of the value of gate resistance 23 to that of gate resistance 27 has been determined as given by expression (2), this not only produces the effect of the fourth embodiment but also stabilizes the switching operation sufficiently for chips at the product stage.

(Another Embodiment)

While in the above embodiments, explanation has been given using IGBT chips as insulated-gate semiconductor elements, the present invention is not limited to this. For instance, application of the present invention to other insulated-gate semiconductor elements, such as MOSFET chips or IEGT chips, produces a similar effect.

As described above, with the present invention, it is possible to provide a pressure-contact semiconductor device capable of not only decreasing the inductance components of the gate leads but also improving the stability of the switching operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pressure-contact semiconductor device comprising:
   a first main electrode plate;
   a second main electrode plate facing said first main electrode plate;
   an insulating enclosure for holding a periphery of each of said first and said second main electrode plates in such a manner that said first and said second main electrode plates face each other;
   a gate terminal provided in such a manner as to penetrate said enclosure;
   a gate electrode plate of a planar shape having a plurality of openings, said gate electrode plate being insulatively provided on a main surface of said first main electrode plate facing said second main electrode plate and being electrically connected to said gate terminal;
   pressure-contact pins which are insulatively provided on said main surface of said first main electrode plate and which are electrically connected to said gate electrode plate; and
   semiconductor chips which include a plurality of IGBT chips and are arranged in an array on said second electrode plate, in such a manner that said semiconductor chips are sandwiched and pressed by said first and said second main electrode plates, each of said IGBT chips having first and second main electrodes in pressure-contact with said first and said second main electrode plates, respectively, and a gate electrode with which a corresponding one of said pressure-contact pins comes into pressure-contact,
   wherein said plurality of IGBT chips are disposed on said second main electrode plate, in correspondence to said plurality of openings of said gate electrode plate, so as to be each surrounded by part of said gate electrode plate and prevent oscillation due to gate wiring inductance among said IGBT chips.

2. The pressure-contact semiconductor device according to claim 1, wherein said first main electrode plate has a network of grooves for forming projecting portions that come into contact with said plurality of semiconductor chips in a one-to-one correspondence and said plurality of openings of said gate electrode plate are engaged with said projecting portions of said first main electrode plate.

3. The pressure-contact semiconductor device according to claim 1, further comprising at least one of an oscillation prevention resistor and an oscillation prevention magnetizer between said gate electrode plate and each of said pressure-contact pins.

4. The pressure-contact semiconductor device according to claim 1, wherein said semiconductor chips comprise diode chips, each of said diode chips having two main electrodes in pressure-contact with said first and said second main electrode plates, respectively.

5. The pressure-contact semiconductor device according to claim 1, wherein said pressure-contact pins include springs so as to make pressure-contact with said gate electrode.

6. The pressure-contact semiconductor device according to claim 1, wherein said gate electrode plate is made of a metal plate.

7. The pressure-contact semiconductor device according to claim 4, wherein said diode chips are disposed on said second main electrode plate, in correspondence to said plurality of openings of said gate electrode plate.

8. A pressure-contact semiconductor device comprising:
a first main electrode plate;
a second main electrode plate facing said first main electrode plate;
an insulating enclosure for holding a periphery of each of said first and said second main electrode plates in such a manner that said first and said second main electrode plates face each other;
a gate terminal provided in such a manner as to penetrate said enclosure;
a gate electrode plate of a planar shape having a plurality of openings, said gate electrode plate being insulatively provided on a main surface of said first main electrode plate facing said second main electrode plate and being electrically connected to said gate terminal;
pressure-contact pins which are insulatively provided on said main surface of said first main electrode plate and which are electrically connected to said gate electrode plate; and
semiconductor chips which include a plurality of IGBT chips and are arranged in an array on said second electrode plate, in such a manner that said semiconductor chips are sandwiched and pressed by said first and said second main electrode plates, each of said IGBT chips having first and second main electrodes in pressure-contact with said first and said second main electrode plates, respectively, and a gate electrode with which a corresponding one of said pressure-contact pins comes into pressure-contact with,
wherein said plurality of IGBT chips are disposed on said second main electrode plate, in correspondence to said plurality of openings of said gate electrode plate, so as to have a plurality of gate wiring routes between any two of said IGBT chips and prevent oscillation due to gate wiring inductance among said IGBT chips.

9. The pressure-contact semiconductor device according to claim 8, wherein said first main electrode plate has a network of grooves for forming projecting portions that come into contact with said plurality of semiconductor chips in a one-to-one correspondence, and
said plurality of openings of said gate electrode plate are engaged with said projecting portions of said first main electrode plate.

10. The pressure-contact semiconductor device according to claim 8, wherein said semiconductor chips comprise diode chips, each of said diode chips having two main electrodes in pressure-contact with said first and said second main electrode plates, respectively.

11. The pressure-contact semiconductor device according to claim 10, wherein said diode chips are disposed on said second main electrode plate, in correspondence to said plurality of openings of said gate electrode plate.

12. A pressure-contact semiconductor device comprising:
a first main electrode plate;
a second main electrode plate facing said first main electrode plate;
an insulating enclosure for holding a periphery of each of said first and said second main electrode plates in such a manner that said first and said second main electrode plates face each other;
a gate terminal provided in such a manner as to penetrate said enclosure;
a gate electrode plate of a planar shape having a plurality of openings, said gate electrode plate being insulatively provided on a main surface of said first main electrode plate facing said second main electrode plate and being electrically connected to said gate terminal;
pressure-contact pins which are insulatively provided on said main surface of said first main electrode plate and which are electrically connected to said gate electrode plate; and
semiconductor chips which include a plurality of IGBT chips and are arranged in an array on said second electrode plate, in such a manner that said semiconductor chips are sandwiched and pressed by said first and said second main electrode plates, each of said IGBT chips having first and second main electrodes in pressure-contact with said first and said second main electrode plates, respectively, and a gate electrode with which a corresponding one of said pressure-contact pins comes into pressure-contact with,
wherein said plurality of IGBT chips are disposed on said second main electrode plate, in correspondence to said plurality of openings of said gate electrode plate, so as to have a plurality of gate wiring routes from said gate terminal to each of said IGBT chips.

13. The pressure-contact semiconductor device according to claim 12, wherein said first main electrode plate has a network of grooves for forming projecting portions that come into contact with said plurality of semiconductor chips in a one-to-one correspondence, and said plurality of openings of said gate electrode plate are engaged with said projecting portions of said first main electrode plate.

14. The pressure-contact semiconductor device according to claim 12, wherein said semiconductor chips comprise diode chips, each of said diode chips having two main electrodes in pressure-contact with said first and said second main electrode plates, respectively.

15. The pressure-contact semiconductor device according to claim 14, wherein said diode chips are disposed on said second main electrode plate, in correspondence to said plurality of openings of said gate electrode plate.

* * * * *